(12) United States Patent
You

(10) Patent No.: US 12,402,483 B2
(45) Date of Patent: Aug. 26, 2025

(54) DISPLAY DEVICE AND MANUFACTURING METHOD THEREOF

(71) Applicant: Samsung Display Co., Ltd., Yongin-Si (KR)

(72) Inventor: Chun Gi You, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 742 days.

(21) Appl. No.: 17/672,419

(22) Filed: Feb. 15, 2022

(65) Prior Publication Data

US 2023/0060667 A1   Mar. 2, 2023

(30) Foreign Application Priority Data

Aug. 27, 2021   (KR) .................. 10-2021-0114163

(51) Int. Cl.
*H10K 59/122* (2023.01)
*H10K 59/123* (2023.01)
*H10K 59/124* (2023.01)
*H10K 71/00* (2023.01)
*H10K 102/10* (2023.01)

(52) U.S. Cl.
CPC ......... *H10K 59/122* (2023.02); *H10K 59/123* (2023.02); *H10K 59/124* (2023.02); *H10K 71/00* (2023.02); *H10K 2102/103* (2023.02)

(58) Field of Classification Search
CPC .................................................. H10K 59/122
See application file for complete search history.

(56) References Cited

U.S. PATENT DOCUMENTS

| | | | |
|---|---|---|---|
| 2013/0234117 A1* | 9/2013 | Kim | H10K 50/818 438/34 |
| 2016/0020430 A1* | 1/2016 | Kim | H10K 50/856 257/40 |
| 2019/0115409 A1* | 4/2019 | Huh | H10D 86/40 |

FOREIGN PATENT DOCUMENTS

| | | |
|---|---|---|
| KR | 10-2021-0043792 A | 4/2021 |
| KR | 10-2243041 B1 | 4/2021 |
| KR | 10-2021-0073092 A | 6/2021 |
| KR | 10-2021-0076293 A | 6/2021 |

* cited by examiner

*Primary Examiner* — Douglas M Menz
(74) *Attorney, Agent, or Firm* — Innovation Counsel LLP

(57) ABSTRACT

A light emitting display device includes a substrate, a transistor, an insulating layer, a pixel electrode, an extension electrode, and a pixel defining layer. The transistor overlaps the substrate. The insulating layer overlaps the transistor. The pixel electrode is disposed on a face of the insulating layer. The extension electrode extends from the pixel electrode. The pixel electrode is electrically connected through the extension electrode to the transistor. The pixel defining layer is disposed on the insulating layer and includes an opening that exposes the pixel electrode, and covers the extension electrode. A section of the extension electrode extends lengthwise parallel to the face of the insulating layer and is thicker than the pixel electrode in a direction perpendicular to the face of the insulating layer.

15 Claims, 15 Drawing Sheets

DISPLAY DEVICE AND MANUFACTURING METHOD THEREOF

CROSS-REFERENCE TO RELATED APPLICATION

This application claims priority to Korean Patent Application No. 10-2021-0114163 filed in the Korean Intellectual Property Office on Aug. 27, 2021; the Korean Patent Application is incorporated by reference.

BACKGROUND

(a) Technical Field

This technical field relates to a light emitting display device and a method for manufacturing the light emitting display device.

(b) Description of the Related Art

A light emitting display device includes light emitting diodes and may display an image by controlling luminance levels of the light emitting diodes. The light emitting display device does not require a backlight and therefore may be desirably thin and lightweight.

Light emitting display devices may be included in various electronic devices, such as smart phones, tablet computers, monitors, televisions, and user interfaces for automobiles.

SUMMARY

A light emitting display device may include a pixel defining layer for defining pixel regions. The pixel defining layer may include black pigment, for improving optical characteristics (such as contrast ratio) of the display device. In a process of forming the black pixel defining layer and/or subsequent processes, if unwanted black pigment or unwanted material related to the black pixel defining layer remains in the display device, defects such as dark dots may be visible in images displayed by the display device. Embodiments may be related a light emitting display device and an associated manufacturing method that can prevent or minimize the defects, such that satisfactory image quality may be attained.

A light emitting display device according to an embodiment includes the following elements: a substrate; a transistor disposed on the substrate; an insulating layer disposed on the transistor; a pixel electrode disposed on the insulating layer; an extension electrode extending from the pixel electrode and electrically connected to the transistor; and a pixel defining layer disposed on the insulating layer and including an opening that overlaps the pixel electrode. The pixel defining layer overlaps the extension electrode, and the extension electrode is thicker than the pixel electrode.

The extension electrode comprises a plurality of layers, and the uppermost layer of the plurality of layers comprises an oxide semiconductor.

The uppermost layer may include at least one of an indium-zinc oxide (IZO), an indium-gallium-zinc oxide (IGZO), an indium-zinc-tin oxide (IZTO), a zinc-tin oxide (ZTO), and a zinc oxide (ZnO).

The plurality of layers of the extension electrode may include one or more layers continuously extending from the pixel electrode, and the uppermost layer.

The at least one layer may include a first conductive layer including a transparent conductive oxide, a second conductive layer including a metal, and a third conductive layer including a transparent conductive oxide.

The extension electrode may be thicker than the pixel electrode by a thickness of the uppermost layer of the extension electrode.

The pixel defining layer may have a double step structure at an edge that defines the opening.

The edge of the pixel defining layer may have an inflection point where a slope of an upper surface increases toward the opening in a cross-section view and then decreases.

The extension electrode may be connected to the transistor or a connecting member connected with the transistor through a contact hole formed in the insulating layer.

The pixel defining layer may be a black pixel defining layer including a black pigment.

A light emitting display device according to an embodiment includes the following elements: a substrate; a transistor disposed on the substrate; one or more insulating layers disposed on the transistor; a pixel electrode disposed on the one or more insulating layers and including a plurality of conductive layers; an extension electrode extending from the pixel electrode and electrically connected to the transistor; a pixel defining layer disposed on the insulating layer, including an opening overlapping the pixel electrode, and covering an edge of the pixel electrode and the extension electrode; an emission layer disposed on the pixel electrode and overlapping the opening; and a common electrode disposed on the emission layer. The extension electrode includes a plurality of conductive layers and an oxide semiconductor layer disposed on the plurality of conductive layers.

The oxide semiconductor layer may include at least one of an indium-zinc oxide (IZO), an indium-gallium-zinc oxide (IGZO), an indium-zinc-tin oxide (IZTO), a zinc-tin oxide (ZTO), and a zinc oxide (ZnO).

The plurality of conductive layers of the extension electrode may continuously extend from a plurality of conductive layers of the pixel electrode.

A thickness of the extension electrode may be larger than a thickness of the pixel electrode.

The pixel defining layer may be a black pixel defining layer including a black pigment. The light emitting display device may further include a spacer disposed on the pixel defining layer and containing a material that is different from that of the pixel defining layer.

The one or more insulating layers may include a passivation layer, a first planarization layer disposed on the passivation layer, and a second planarization layer disposed on the first planarization layer. The light emitting display device may further include a connecting member disposed between the first planarization layer and the second planarization layer. The connecting member may be connected to the transistor through a contact hole formed in the passivation layer and the first planarization layer. The extension electrode may be connected to the connecting member through a contact hole formed in the second planarization layer.

A method for manufacturing a light emitting display device according to an embodiment includes the following steps: forming a transistor on a substrate; forming an insulating layer on the transistor; forming a conductive material layer on the insulating layer and forming a masking layer on the conductive material layer; forming a pixel electrode by patterning the masking layer and the conductive material layer, and an extension electrode that extends from the pixel electrode and is electrically connected to the transistor; forming a pixel defining layer that includes an opening overlapping the pixel electrode by coating and patterning a black photoresist on the insulating layer; removing the masking layer disposed on the pixel electrode; and curing the pixel defining layer.

The masking layer may include an oxide semiconductor.

The removing of the masking layer may include wet-etching using the pixel defining layer as a mask.

During the removing of the masking layer, a gap may be formed between the pixel defining layer and the pixel electrode, and during the curing of the pixel defining layer, the gap may be filled by reflowing the pixel defining layer.

An embodiment may be related to a light emitting display device. The light emitting display device may include a substrate, a transistor, an insulating layer, a pixel electrode, an extension electrode, and a pixel defining layer. The transistor may overlap the substrate. The insulating layer may overlap the transistor. The pixel electrode may be disposed on a face of the insulating layer. The extension electrode may extend from the pixel electrode. The pixel electrode may be electrically connected through the extension electrode to the transistor. The pixel defining layer may be disposed on the insulating layer, may include an opening that exposes the pixel electrode, and may cover the extension electrode. A section of the extension electrode may be disposed on the face of the insulating layer, may extend lengthwise parallel to the face of the insulating layer, and may be thicker than the pixel electrode in a direction perpendicular to the face of the insulating layer.

The extension electrode may include a first layer and a second layer. The first layer may be disposed between the second layer and the pixel defining layer and may include an oxide semiconductor.

The first layer may include at least one of an indium-zinc oxide (IZO), an indium-gallium-zinc oxide (IGZO), an indium-zinc-tin oxide (IZTO), a zinc-tin oxide (ZTO), and a zinc oxide (ZnO).

The second layer may be directly connected to the pixel electrode.

The second layer may include a first transparent conductive oxide layer, a metal layer, and a second transparent conductive oxide layer.

The extension electrode may be thicker than the pixel electrode by a thickness of the first layer.

The pixel defining layer may include a concave structure that overlaps the extension electrode.

The pixel defining layer may include a convex structure positioned between the concave structure and the opening.

The insulating layer may include a contact hole. The extension electrode may be partially disposed inside the contact hole.

The pixel defining layer may be a black pixel defining layer including a black pigment.

An embodiment may be related to a light emitting display device. The light emitting display device may include the following elements: a substrate; a transistor overlapping the substrate; an insulating layer overlapping the transistor; a pixel electrode disposed on a face of the insulating layer and including a first plurality of conductive layers; an extension electrode extending from the pixel electrode, disposed on the face of the insulating layer, including a second plurality of conductive layers, and including an oxide semiconductor layer disposed on the second plurality of conductive layers, wherein the pixel electrode may be electrically connected through the extension electrode to the transistor; a pixel defining layer disposed on the insulating layer, exposing an exposed portion of the pixel electrode, covering an edge of the pixel electrode, and covering the extension electrode; an emission layer overlapping the exposed portion of the pixel electrode; and a common electrode overlapping the emission layer.

The oxide semiconductor layer may include at least one of an indium-zinc oxide (IZO), an indium-gallium-zinc oxide (IGZO), an indium-zinc-tin oxide (IZTO), a zinc-tin oxide (ZTO), and a zinc oxide (ZnO).

The second plurality of conductive layers may be directly connected to the first plurality of conductive layers.

A section of the extension electrode may extend lengthwise parallel to the face of the insulating layer and may be thicker than the pixel electrode in a direction perpendicular to the face of the insulating layer.

The light emitting display device may include a spacer. The pixel defining layer may be disposed between the insulating layer and the spacer and may include a black pigment. A material of the spacer may be different from a material of the pixel defining layer.

The light emitting display device may include a connecting member. The oxide semiconductor layer may be electrically connected through the second plurality of conductive layers to the connecting member. The second plurality of conductive layers may be electrically connected through the connecting member to the transistor.

An embodiment may be related to a method for manufacturing a light emitting display device. The method may include the following steps: forming a transistor that overlaps a substrate; forming an insulating layer that overlaps the transistor; forming a conductive material layer on the insulating layer; forming a masking material layer on the conductive material layer; partially removing the masking material layer and the conductive material layer to form a masking layer and a conductive layer; forming a pixel defining material layer that partially covers a covered portion of the masking layer and includes an opening that exposes an exposed portion of the masking layer; removing at least the exposed portion of the masking layer to form a pixel electrode and an extension electrode, wherein the pixel electrode may include a first section of the conductive layer and may be electrically connected through the extension electrode to the transistor, and wherein the extension electrode may include a second section of the conductive layer and the covered portion of the masking layer; and curing the pixel defining material layer to form a pixel defining layer that (partially) exposes the pixel electrode and covers the extension electrode.

The masking layer comprises an oxide semiconductor.

The method may include wet-etching the exposed portion of the masking layer using the pixel defining material layer as a mask.

The method may include reflowing the pixel defining material layer during the curing to fill a gap between the pixel defining material layer and the pixel electrode. The gap may be formed when the at least the exposed portion of masking layer is removed.

According to embodiments, a light emitting display device may display images with minimum defects (such as dark spots) and with satisfactory image quality.

DETAILED DESCRIPTION OF EMBODIMENTS

Examples of embodiments are described with reference to the accompanying drawings.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

When a first element is referred to as being "on" a second element, the first element can be directly on the second element, or one or more intervening elements may be present between the first element and the second element. When a first element is referred to as being "directly on" a second element, there are no intervening elements (except for environmental elements such as air) present between the first element and the second element.

The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." The term "adjacent" may mean "immediately adjacent." The expression that an element extends in a particular direction may mean that the element extends lengthwise in the particular direction and/or that the lengthwise direction of the element is in the particular direction. The term "pattern" may mean "member." The term "defined" may mean "formed" or "provided." The expression that a space or opening overlaps an object may mean that (the position of) the space or opening overlaps with (the position of) the object. The term "overlap" may be equivalent to "be overlapped by." The expression that a first element overlaps with a second element in a plan view may mean that the first element overlaps the second element in direction perpendicular to a substrate.

In drawing, the signs "x" and "z" under "y" are used to indicate directions, where "x" is a first direction, "y" is a second direction perpendicular to the first direction, and "z" is a third direction perpendicular to each of the first direction and the second direction.

Figure 1:
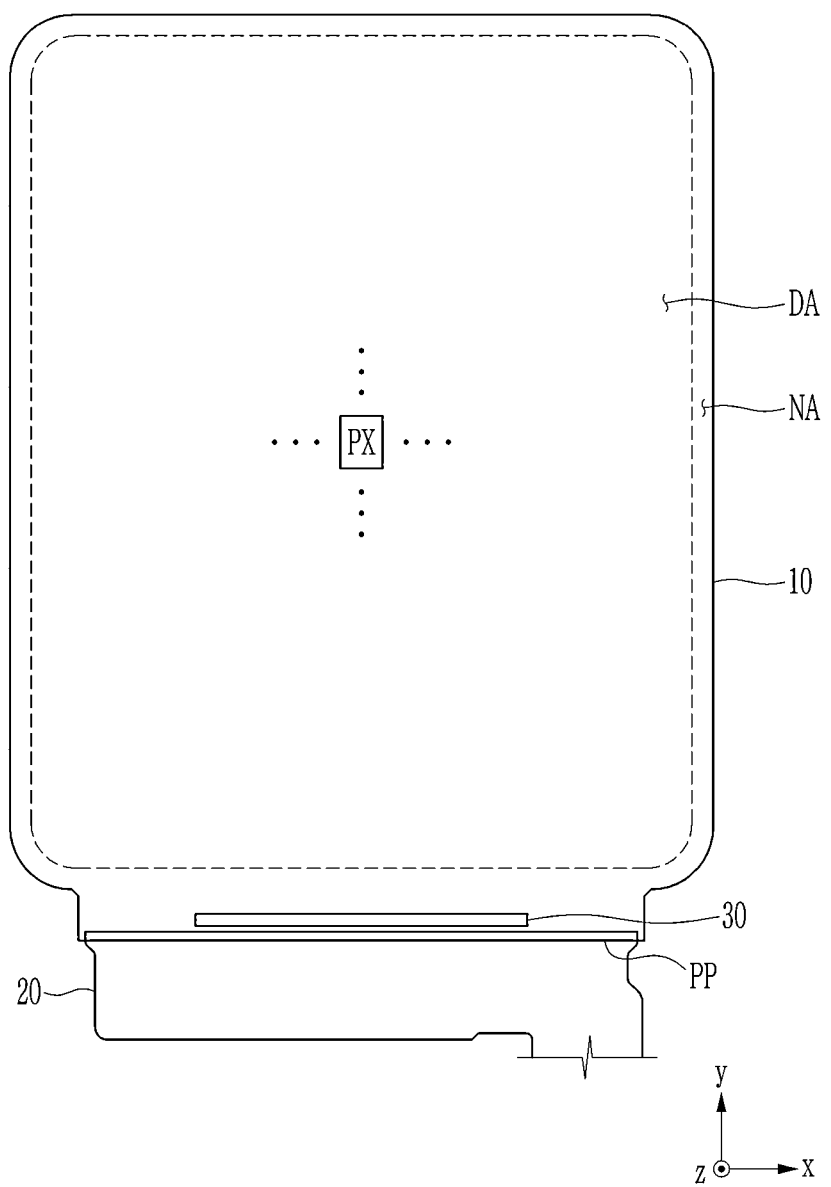
FIG. 1 is a schematic top plan view of a light emitting display device according to an embodiment.

FIG. 1 is a schematic top plan view of a light emitting display device according to an embodiment.

Referring to FIG. 1, a light emitting display device (also referred to as a display device) may include a display panel 10, a flexible printed circuit film 20 bonded to the display panel 10, and an integrated circuit chip 30.

The display panel 10 may include a display area DA for displaying an image and may include a non-display area NA for accommodating circuits and/or signal lines for generating and/or transmitting signals applied to the display area DA. The non-display area NA may surround the display area DA.

In the display area DA, pixels PX may be disposed in a matrix form (or array). Signal lines such as a gate line (also referred to as a scan line), a data line, and a driving voltage line may be disposed in the display area DA. A gate line, a data line, a driving voltage line, and the like are connected to a pixel PX, and the pixel PX receives a gate signal (also called a scan signal), a data voltage, and a driving voltage (first power voltage or high potential power voltage) from these signal lines. The pixel PX can be a light-emitting device such as a light emitting diode LED.

A touch sensor for detecting a user's contact and/or non-contact touches may be disposed in the display area DA. In a plan view, the display area DA may have one or more of various shapes, such as a quadrangle shape, a polygon shape, a circle shape, and/or an oval shape.

In the non-display area NA, a pad portion PP may be positioned and may include pads for receiving signals from one or more external devices. The pad portion PP may be oriented in a first direction (x) along one edge of the display panel 10. The flexible printed circuit film 20 may be bonded to the pad portion PP, and pads of the flexible printed circuit film 20 may be electrically connected to the pads of the pad portion PP.

At least one driving unit that generates and/or processes signals for driving the display panel 10 may be positioned in the non-display area NA. The pixels PX may receive data voltages according to gate signals generated by a gate driver. The gate driver may be integrated on the display panel 10 and positioned on at least one side of the display area DA. A data driver and a signal controller may be implemented in an integrated circuit chip 30 (also referred to as a driving IC chip 30), and the integrated circuit chip 30 may be mounted in the non-display area NA. The integrated circuit chip 30 may be mounted on the flexible printed circuit film 20 or the like and electrically connected to the display panel 10.

Figure 2:
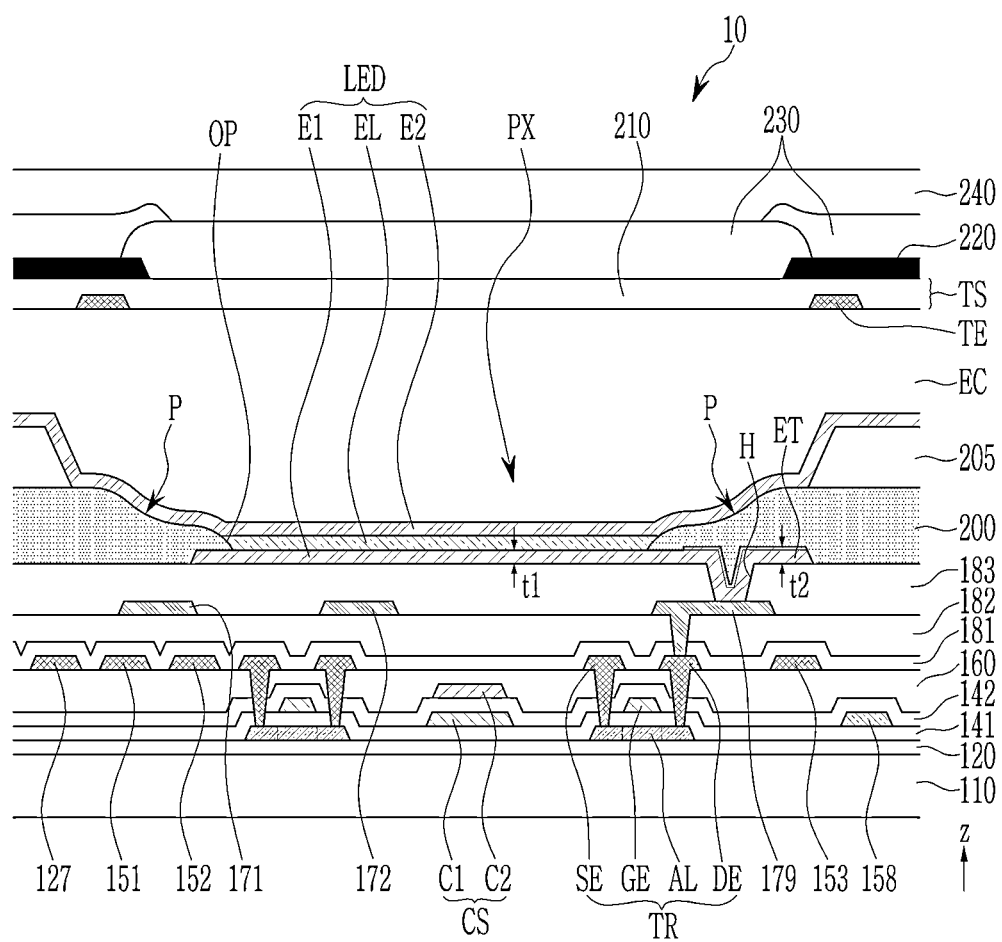
FIG. 2 is a schematic cross-sectional view of one pixel area in a display panel of a light emitting display device according to an embodiment.

FIG. 2 is a schematic cross-sectional view of one pixel area in the display panel 10 according to the embodiment.

Referring to FIG. 2, the display panel 10 may include a substrate 110, a transistor TR formed on (and/or overlapping) the substrate 110, and a light emitting diode LED connected to the transistor TR. The light emitting diode LED may correspond to a pixel PX.

The substrate 110 may be a glass substrate. The substrate 110 may be a flexible substrate including a polymer such as polyimide, polyamide, or polyethylene terephthalate.

The buffer layer 120 may be positioned on the substrate 110. When the semiconductor layer AL is formed, the buffer layer 120 blocks impurities from the substrate 110 to improve the characteristics of the semiconductor layer AL, and can relieve the stress of the semiconductor layer AL by providing a flat surface over the substrate 110. The buffer layer 120 may include at least one of a silicon nitride (SiNx), a silicon oxide (SiOx), a silicon oxynitride (SiOxNy), and the like. The buffer layer 120 may include amorphous silicon.

The semiconductor layer AL may be positioned on the buffer layer 120. The semiconductor layer AL may include a first region, a second region, and a channel region between the first region and the second region. The semiconductor layer AL may include polysilicon, amorphous silicon, or an oxide semiconductor.

A first gate insulating layer 141 may be positioned on the semiconductor layer AL. The first gate insulating layer 141 may include an inorganic insulating material such as a silicon oxide, a silicon nitride, or a silicon nitride, and may be a single layer or multiple layers.

A first gate conductive layer may be positioned on the first gate insulating layer 141 and may include a bypass control line 158, a gate electrode GE, and a first electrode C1 of a storage capacitor CS, etc. The members of the first gate conductive layer may be formed of the same material in the same process. The gate electrode GE may overlap a channel region of the semiconductor layer AL. The first gate conductive layer may include at least one of molybdenum (Mo), aluminum (Al), copper (Cu), titanium (Ti), and the like, and may be a single layer or multiple layers.

A second gate insulating layer 142 may be positioned on the first gate conductive layer. The second gate insulating layer 142 may include an inorganic insulating material such as at least one of a silicon nitride, a silicon oxide, or a silicon oxynitride, and may be a single layer or multiple layers.

A second gate conductive layer may be positioned on the second gate insulating layer 142 and may include a second electrode C2 of a storage capacitor CS, and the like. The second electrode C2 may overlap the first electrode C1; the first electrode C1, the second electrode C2, and the intervening second gate insulating layer 142 may form the storage capacitor CS. The members of the second gate conductive layer may be formed of the same material in the same process. The second gate conductive layer may include molybdenum (Mo), aluminum (Al), copper (Cu), titanium (Ti), or the like, and may be a single layer or multiple layers.

An interlayer insulating layer 160 may be positioned on the second gate conductive layer. The interlayer insulating layer 160 may include an inorganic insulating material such as at least one of a silicon nitride, a silicon oxide, or a silicon nitride, and may be a single layer or multiple layers. When the interlayer insulating layer 160 is a multilayer structure, a lower layer may include a silicon nitride, and an upper layer may include a silicon oxide.

A first data conductive layer may be positioned on the interlayer insulating layer 160 and may include a first electrode SE and a second electrode DE of the transistor TR, an initialization voltage line 127, a scan line 151, a previous scan line 152 (or neighboring scan line 152), a light emission control line 153, and the like. The members of the first data conductive layer may be formed of the same material in the same process. One of the first electrode SE and the second electrode DE may be a source electrode of the transistor TR, and the other may be a drain electrode of the transistor TR. At least one of the initialization voltage line 127, the scan line 151, the previous scan line 152, and the light emission control line 153 may be included in the first gate conductive layer or the second gate conductive layer. The first data conductive layer may include at least one of aluminum (Al), platinum (Pt), palladium (Pd), silver (Ag), magnesium (Mg), gold (Au), nickel (Ni), neodymium Nd, iridium (Ir), chromium (Cr), calcium (Ca), molybdenum (Mo), titanium (Ti), tungsten (W), copper (Cu), and the like, and may be a single layer or multiple layers. For example, the first data conductive layer may include a lower layer containing a refractory metal such as at least one of molybdenum, chromium, tantalum, titanium, and the like, may include an intermediate layer containing a metal having low resistivity such as at least one of aluminum, copper, and silver, and may include an upper layer containing a refractory metal. For example, the first data conductive layer may have a triple layer structure of titanium-aluminum-titanium (Ti—Al—Ti).

A passivation layer 181 may be positioned on the first data conductive layer. The passivation layer 181 may include an inorganic insulating material such as a silicon oxide or a silicon nitride.

A first planarization layer 182 may be positioned on the passivation layer 181. The first planarization layer 182 may include an organic insulating material such as at least one of a general-purpose polymer (such as polymethyl methacrylate), polystyrene, a derivative of a polymer having a phenolic group, an acryl-based polymer, an imide-based polymer (e.g., polyimide), a siloxane-based polymer, and the like.

A second data conductive layer may be positioned on the first planarization layer 182 and may include a data line 171, a driving voltage line 172, a connecting member 179, and the like. The connecting member 179 may be connected to the second electrode DE of the transistor TR through a contact hole formed in the first planarization layer 182 and the passivation layer 181. The second conductive layer may further include at least one of an initialization voltage line 127, a scan line 151, a previous scan line 152, and a light emission control line 153. At least one of the data line 171 and the driving voltage line 172 may be included in the first data conductive layer. The members of the second data conductive layer may be formed of the same material in the same process. The second data conductive layer may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers. For example, the second data conductive layer may have a triple layer structure of titanium-aluminum-titanium (Ti—Al—Ti).

A second planarization layer 183 may be positioned on the second data conductive layer. The second planarization layer 183 may include an organic insulating material such as at least one of a general-purpose polymer (such as polymethyl methacrylate), polystyrene, a derivative of a polymer having a phenolic group, an acryl-based polymer, an imide-based polymer (e.g., polyimide), a siloxane-based polymer, and the like.

A pixel electrode E1 and an extension electrode ET of the light emitting diode LED may be positioned (directly) on a face of the second planarization layer 183. The extension electrode ET may extend from the pixel electrode E1 and may be connected to the connecting member 179 through a contact hole H formed in the second planarization layer 183. The extension electrode ET may include a connecting portion positioned in the contact hole H and may include an extending portion positioned (directly) on the face of the second planarization layer 183 and extending lengthwise in a direction parallel to the face of the second planarization layer 183. The extension electrode ET may be integrally formed with the pixel electrode E1. A thickness t2 of (the extending portion of) the extension electrode ET may be thicker than a thickness t1 of the pixel electrode E1. Since the connecting member 179 is connected to the second electrode DE, the pixel electrode E1 may be electrically connected to the second electrode DE through the extension electrode ET and the connecting member 179. The pixel electrode E1 and extension electrode ET may be formed of and/or include at least one of a reflective conductive material, a semi-transmissive conductive material, and a transparent conductive material. The pixel electrode E1 may include a transparent conductive material such as an indium tin oxide (ITO) or an indium zinc oxide (IZO). The pixel electrode E1 may include a metal such as lithium (Li), calcium (Ca), aluminum (Al), silver (Ag), magnesium (Mg), or gold (Au). The pixel electrode E1 may have a multi-layered structure, such as a triple layer structure of ITO-silver (Ag)-ITO. The extension electrode ET may have a quadruple layer structure including an additional layer (a masking layer) on a same triple layer (e.g., an ITO-Ag-ITO layer) as the pixel electrode E1. Accordingly, the thickness t2 of the extension electrode ET may be greater than the thickness t1 of the pixel electrode E1 by a thickness of the additional layer. The masking layer may be an oxide semiconductor layer.

A pixel defining layer 200 (also referred to as a partition layer) may be positioned on the second planarization layer 183 and may have an opening OP that (partially) exposes the pixel electrode E1. The pixel defining layer 200 may cover an edge of pixel electrode E1. The covered width of the pixel electrode E1 may be about 3 μm or less. The pixel defining layer 200 may cover the entire extension electrode ET, and the opening OP may not expose the extension electrode ET. The pixel defining layer 200 may include an organic insulating material such as an acryl-based polymer, an imide-based polymer, or an amide-based polymer. The pixel defining layer 200 may be a black pixel defining layer 200 containing a black pigment. For example, the pixel defining layer 220 may include a polyimide binder and a pigment in which red, green, and blue are mixed. The pixel defining layer 220 may include a mixture of a cardo binder resin and a lactam black pigment and a blue pigment. The pixel defining layer 220 may include carbon black.

The black pixel defining layer 200 may improve a contrast ratio and may block light reflected by the underlying metal layer.

The opening OP of the pixel defining layer 200 may be formed by a photolithography process, and a thickness of the pixel defining layer 200 may gradually decrease toward the edge. In the change of the thickness of the pixel defining layer 200, a slope of an upper surface in the cross-section view of an edge portion of the pixel defining layer 200 near the opening OP may increase or be constant toward the opening OP. The thickness of the pixel defining layer 200 may gradually decrease toward the edge. The pixel defining layer 200 may have an inflection point P. A slope of the upper surface of the pixel defining layer 200 between the spacer 205 and the inflection point P is greater than a slope of the upper surface of the pixel defining layer 200 between the inflection point P and the opening OP in the cross-section view. Between the spacer 205 and the opening OP, the pixel defining layer 200 may have a concave structure (or recess structure) corresponding to the point P and positioned between two convex structures. One of the convex structures may be positioned between the opening OP and the concave structure. The pixel defining layer 200 may have a double step structure between the spacer 205 and the opening OP. The double step structure of the pixel defining layer 200 may be a result of the reflow of the edge of the pixel defining layer 200. The concave structure (or recess structure) may overlap the extension electrode ET.

An emission layer EL may be positioned on (the exposed portion of) the pixel electrode E1. The emission layer EL may overlap the edge of the pixel defining layer 200, and at least a portion of the emission layer EL may be positioned in the opening OP. The emission layer EL may include a material layer that emits light of one of primary colors, such as one of red, green, and blue. The emission layer EL may have a structure in which material layers emitting light of different colors are stacked. On the pixel electrode E1, at least one of a hole injection layer, a hole transport layer, an electron transport layer, and an electron injection layer may be positioned in addition to the emission layer EL.

A spacer 205 may be positioned on the pixel defining layer 200. The spacer 205 may include an organic insulating material such as an acryl-based polymer, an imide-based polymer, or an amide-based polymer.

A common electrode E2 (also called an opposite electrode) may be positioned on the emission layer EL and the pixel defining layer 200. The common electrode E2 may be positioned over a plurality of pixels PX. The common electrode E2 may include a metal such as at least one of calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), and the like. The common electrode E2 may include a transparent conductive oxide (TCO) such as indium tin oxide (ITO) or indium zinc oxide (IZO).

The pixel electrode E1, the emission layer EL, and the common electrode E2 may form a light emitting diode LED, which may be an organic light emitting diode. The pixel electrode E1 may be an anode (i.e., a hole injection electrode), and the common electrode E2 may be a cathode (i.e., as an electron injection electrode), and vice versa. The opening OP of the pixel defining layer 200 may correspond to a light emitting region of the light emitting diode LED.

An encapsulation layer EC may be positioned on the common electrode E2. The encapsulation layer EC may be a thin film encapsulation layer including at least one inorganic layer and at least one organic layer stacked on the common electrode E2.

For example, the encapsulation layer EC may have a triple-layer structure of a first inorganic layer, an organic layer, and a second inorganic layer. The encapsulation layer EC may be a substrate.

A touch sensor layer TS may be positioned on the encapsulation layer EC, may include a touch electrode TE, and may include a passivation layer 210 that covers the touch electrode TE. The touch sensor layer TS may detect a user's contact and/or non-contact touch. The touch electrode TE may be formed of a metal (in a mesh structure), a transparent conductive material, a conductive polymer, or the like. The passivation layer 210 may include an inorganic insulating material such as a silicon nitride, a silicon oxide, or a silicon oxynitride, or an organic material such as an acryl-based polymer or a polyimide-based resin. A buffer layer that may include an inorganic insulating material may be positioned between the encapsulation layer EC and the touch sensor layer TS. The touch sensor layer TS may be formed on the encapsulation layer EC, or may be formed on a separate substrate and attached to the encapsulation layer EC.

A light blocking member 220 may be positioned on the touch sensor layer TS. The light blocking member 220 may include a black pigment or dye, and may block light reflected by a metal layer of the display panel 10. The light blocking member 220 may not overlap the opening OP, which is the light emitting region. The light blocking member 220 may be referred to as a black matrix.

A color filter 230 may be positioned on the touch sensor layer TS. The color filter 230 may transmit light of one color among red, green, and blue, for example. Color filters 230 of different colors may overlap the light blocking member 220 in an overlapping region.

The color filter 230 and the light blocking member 220 may serve as an anti-reflection layer in combination. A polarization layer as an anti-reflection layer may not be required. Advantageously, satisfactory light output efficiency can be attained, and the thickness of the display panel 10 can be minimized. The color filter 230 may include quantum dots or phosphor, and may convert light emitted from the light emitting diode LED into red or green. An overcoat layer 240 may be positioned on the color filter 230. The display panel 10 may optionally include a polarization layer as an anti-reflection layer. The polarization layer may be attached to the touch sensor layer TS by an adhesive member such as an optically transparent adhesive (OCA).

FIG. 3 to FIG. 12 are cross-sectional views illustrating structures and processes associated with a method for manufacturing a light emitting display device according to an embodiment.

Figure 3:
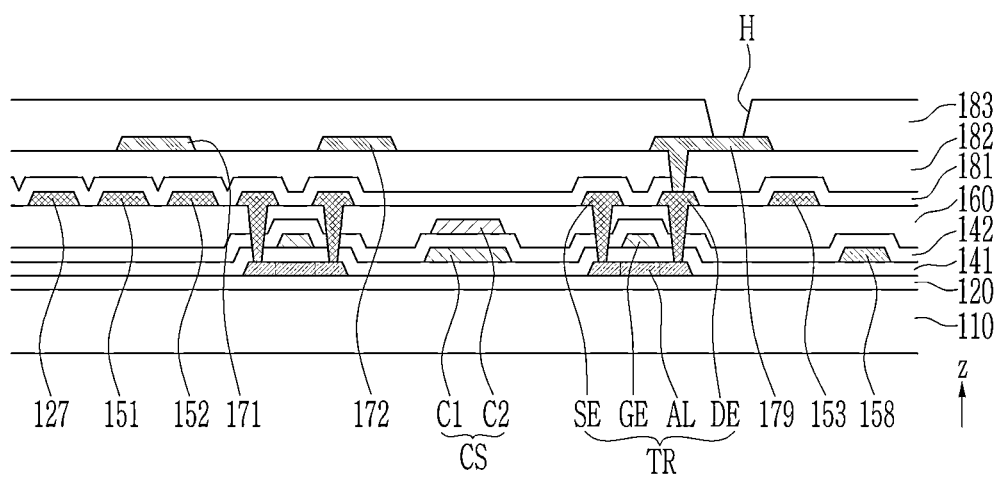
FIG. 3, FIG. 4, FIG. 5, FIG. 6, FIG. 7, FIG. 8, FIG. 9, FIG. 10, FIG. 11, and FIG. 12 are cross-sectional views illustrating structures and processes associated with a method for manufacturing a light emitting display device according to one or more embodiments.

Referring to FIG. 3, the buffer layer 120 may be formed on a substrate 110. After forming a semiconductor material layer on the buffer layer 120, patterning is performed to form the semiconductor layer AL of the transistor TR. The patterning may mean forming a predetermined pattern by partially removing a layer through a photolithography process or the like. The first gate insulating layer 141 may be formed on the semiconductor layer AL. After forming a conductive material layer on the first gate insulating layer 141, it is patterned to form a first gate conductive layer that includes the gate electrode GE of the transistor TR, the first electrode C1 of the storage capacitor CS, the bypass control line 158, and the like. A second gate insulating layer 142 may be formed on the first gate conductive layer. A second gate conductive layer that includes the second electrode C2 of the storage capacitor CS, and the like may be formed on the second gate insulating layer 142. The interlayer insulating layer 160 may be formed on the second gate conductive layer. A conductive material layer is formed on the interlayer insulating layer 160 and then patterned to form a first data conductive layer that includes the first electrode SE and the second electrode DE of the transistor TR, the initialization voltage line 127, the scan line 151, the previous scan line 152, the light emission control line 153, and the like. The passivation layer 181 may be formed on the first data conductive layer. A first planarization layer 182 may be formed on the passivation layer 181. After the conductive material layer is formed on the first planarization layer 182 and patterned, a second data conductive layer that may include a data line 171, a driving voltage line 172, a connecting member 179, and the like may be formed. A second planarization layer 183 may be formed on the second data conductive layer. The second planarization layer 183 may be patterned to form a contact hole H that exposes the connecting member 179.

Figure 4:
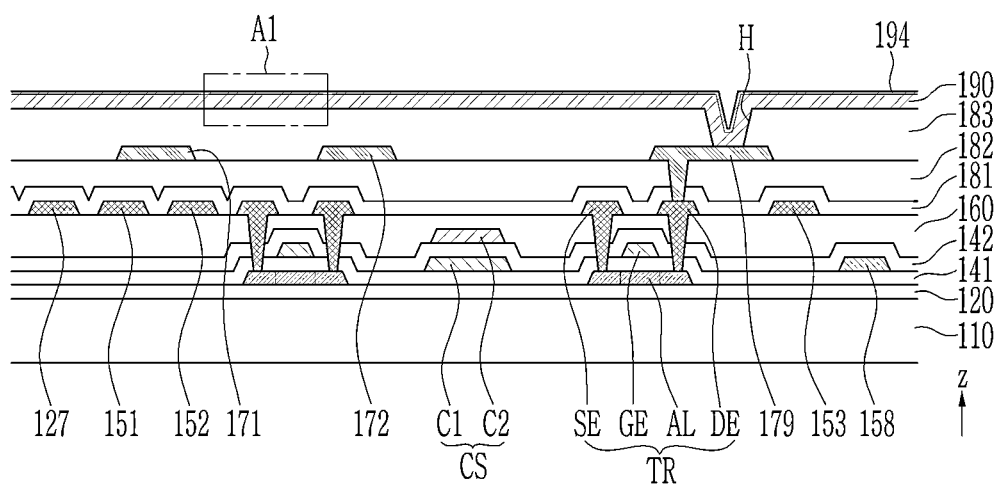
Figure 5:
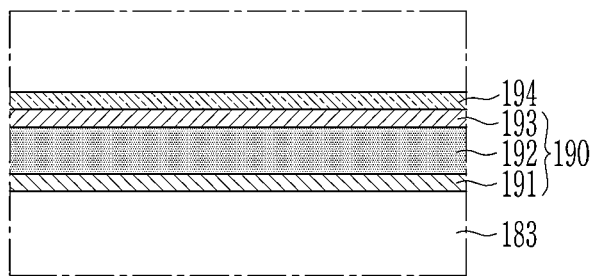

Referring to FIG. 4, a conductive material layer 190 may be formed on the second planarization layer 183, and a masking material layer 194 may be formed on the conductive material layer 190. The masking material layer 194 may be formed directly on the conductive material layer 190 (i.e., without another layer interposed between the conductive material layer 190 and the masking material layer 194). The conductive material layer 190 may be (directly) connected to the connecting member 179 through the contact hole H. Referring to FIG. 5, which illustrates the region A1 of FIG. 4, the conductive material layer 190 may include a first conductive layer 191, a second conductive layer 192, and a third conductive layer 193 that are stacked, and the masking material layer 194 may be formed on the third conductive layer 193. The first conductive layer 191 may include a transparent conductive oxide (e.g., ITO). The second conductive layer 192 may include a metal (e.g., silver (Ag)). The third conductive layer 193 may include a transparent conductive oxide (e.g., ITO).

The masking material layer 194 may be formed of a material that can be etched using an etchant having high selectivity, and may include an oxide semiconductor. The oxide semiconductor may include at least an oxide of at least one metal, such as at least one of zinc (Zn), indium (In), gallium (Ga), tin (Sn), titanium (Ti), and the like. The oxide semiconductor may include at least one of indium-zinc oxide (IZO), indium-gallium-zinc oxide (IGZO), indium-zinc-tin oxide (IZTO), zinc-tin oxide (ZTO), and zinc oxide (ZnO). The masking material layer 194 may include indium-gallium-zinc oxide (IGZO) and/or indium-zinc oxide (IZO). The oxide semiconductor may have conductor or insulator characteristics depending on the oxygen content.

Figure 6:
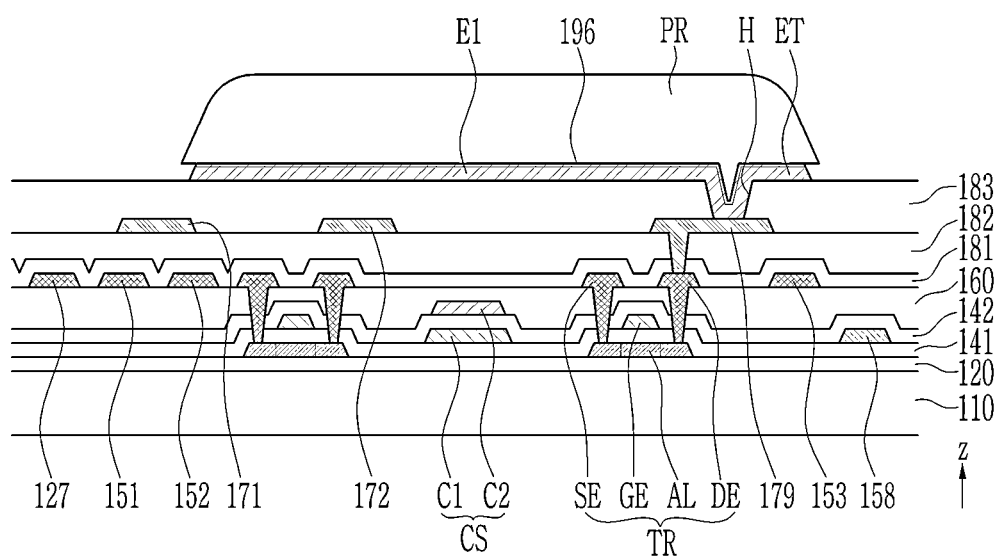

Referring to FIG. 6, the conductive material layer 190 and the masking material layer 194 may be patterned to form a (remaining) conductive layer and a (remaining) masking layer 196 that include the pixel electrode E1 and the extension electrode ET. The patterning of the conductive material layer 190 and the masking material layer 194 may be performed by etching the conductive material layer 190 and the masking material layer 194. For example, after applying (e.g., coating) a photoresist on the masking material layer 194, a photosensitive film pattern PR is formed using a photomask, and the masking material layer 194 and the conductive metal layer 190 are wet-etched by using the photosensitive film pattern PR to form the pixel electrode E1 and the extension electrode ET. When the conductive material layer 190 is etched, since the masking material layer 194 covers the conductive material layer 190, damage to the conductive material layer 190, particularly the third conductive layer 193 near the edge of the pixel electrode E1, can be prevented or reduced. If the third conductive layer 193 is substantially damaged, the material of the second conductive layer 192 may leak through the third conductive layer 193 in the subsequent process (e.g., curing of the pixel defining layer 200). The leaked material (e.g., silver (Ag)) may agglomerate and may cause a short circuit between the pixel electrode E1 and the common electrode E2, which may cause dark spots in displayed images. By preventing damage to the third conductive layer 193 using the masking material layer 194, the dark spots can be prevented.

The masking layer 196 may be positioned on the pixel electrode E1 after the patterning of the conductive material layer 190 and the masking material layer 194. The uppermost layer of the extension electrode ET may be part of the masking layer 196. Since the extension electrode ET is integrally formed with the pixel electrode E1, and the extension electrode ET is electrically connected to the transistor TR through the connecting member 179, the pixel electrode E1 may be electrically connected to the transistor TR. The photosensitive film pattern PR positioned on the pixel electrode E1 and the extension electrode ET may be removed by a strip process.

Figure 7:
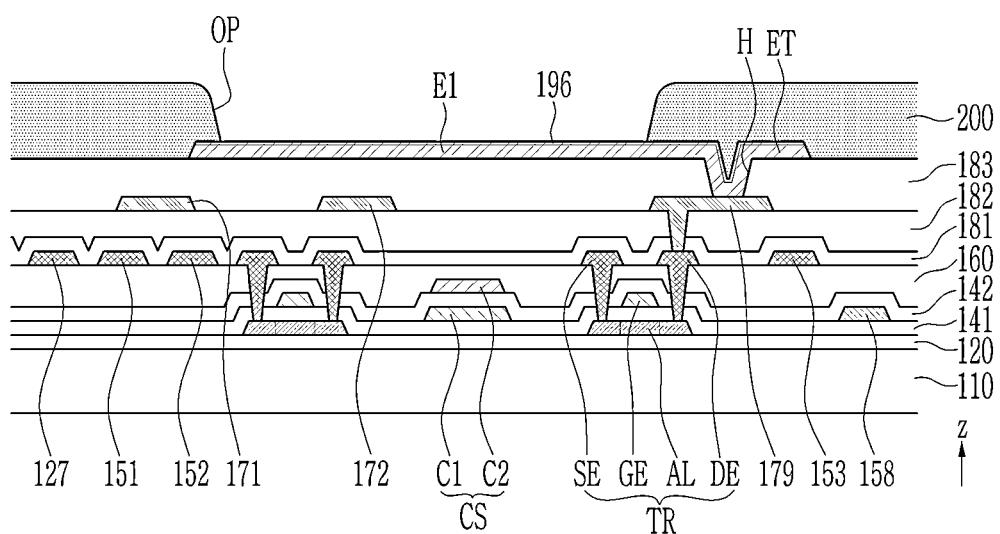

Referring to FIG. 7, a pixel defining layer 200 with an opening OP exposing the pixel electrode E1 may be formed by applying a colored material layer on the second planarization layer 183 and patterning the colored material layer. A black photoresist may be coated on the second planarization layer 183, the pixel electrode E1, and the extension electrode ET. Subsequently, soft baking is performed at a first temperature. Subsequently, light is selectively irradiated using a photomask and developed for patterning. A region not irradiated with light in the coated photoresist may be removed using a developer. As a result, at least a portion of the masking layer 196 may be exposed. The removed region may correspond to the opening OP. After developing the pixel defining layer 200, hard baking may be performed at a second temperature. The pixel defining layer 200 may cover the edge of the pixel electrode E1, and may completely cover the extension electrode ET. The black photoresist may be a photosensitive compound in which black pigment is dispersed, and the photosensitive compound may include a polymer, a monomer, and a photopolymerization initiator. The black photoresist may be a negative photoresist. When the pixel defining layer 200 is formed, the pixel electrode E1 is covered by the masking layer 196, and thus the material for forming the pixel defining layer 200 may be prevented from contacting or sticking to the pixel electrode E1.

Figure 8:
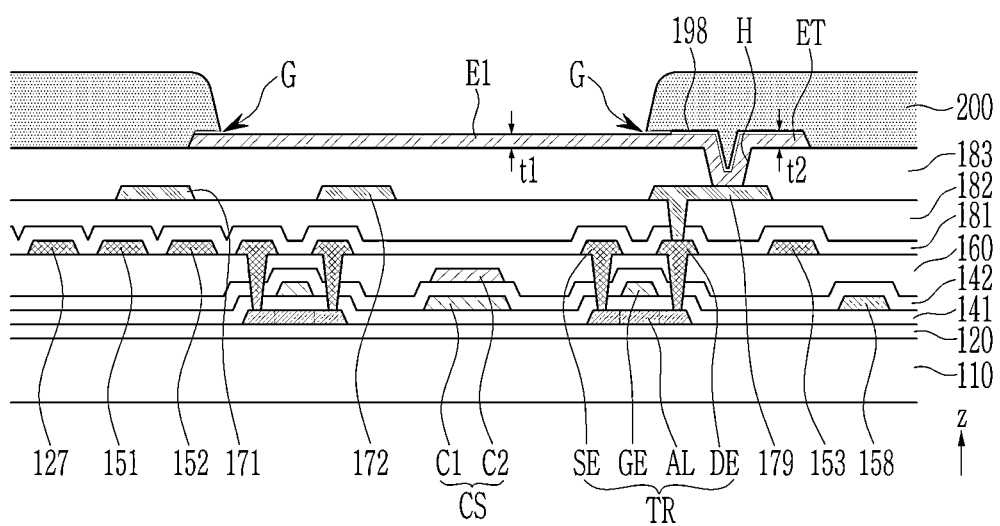
Figure 9:
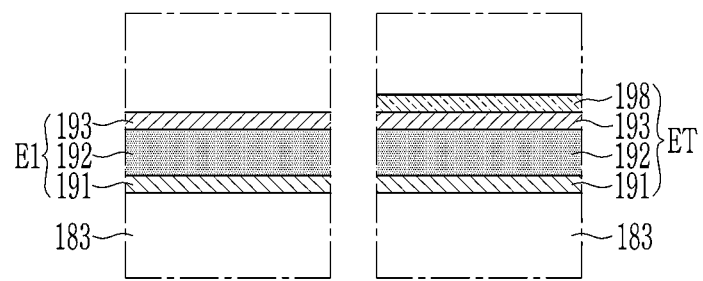

Referring to FIG. 7 and FIG. 8, the portion of the masking layer 196 positioned on the pixel electrode E1 (including the exposed portion and some covered portion of the masking layer 196) can be removed by etching using the pixel defining layer 200 as a mask. Accordingly, as shown in FIG. 9, the pixel electrode E1 may include a first conductive layer 191, a second conductive layer 192, and a third conductive layer 193, and may include no portion of the masking layer 196. The extension electrode ET may include a first conductive layer 191, a second conductive layer 192, and a third conductive layer 193, and may further include a covered masking layer 198 (i.e., a covered portion of the masking layer 196) on the third conductive layer 193. The uppermost layer of the pixel electrode E1 may be a third conductive layer 193, and the uppermost layer of the extension electrode ET may be the covered masking layer 198. A thickness t1 of the pixel electrode E1 may be thinner by a thickness of the covered masking layer 198 than a thickness t2 of the extension electrode ET.

When the portion of the masking layer 196 on the pixel electrode E1 is removed, the overlying unwanted material associated with the pixel defining layer 200 may also be removed. If unwanted material associated with the pixel defining layer 200 causes a short circuit between the pixel electrode E1 and the common electrode E2, dark spots may undesirably show in displayed images. Since the unwanted material is removed when the portion of the masking layer 196 is removed, dark spots can be prevented.

The portion of the masking layer 196 on the pixel electrode E1 can be wet-etched using an etchant having a high selectivity ratio to the pixel electrode E1, particularly, to the third conductive layer 193. Although the masking layer 196 is used to prevent damage to the pixel electrode E1 in the manufacturing process of the display device, the portion of the masking layer 196 on the pixel electrode E1 can be removed without adding a photomask. Due to the isotropy of the wet-etching, a portion of the masking layer 196 on the edge of pixel electrode E1 covered by the pixel defining layer 200 can also be removed. As a result, a gap G may be formed between the pixel defining layer 200 and the pixel electrode E1.

Figure 10:
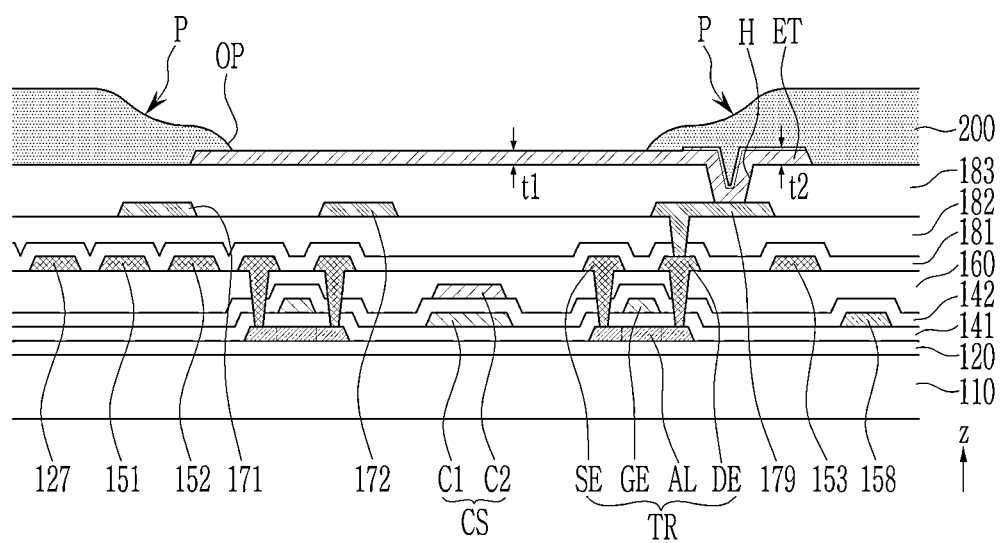

Referring to FIG. 10, after the portion of the masking material layer 194 on the pixel electrode E1 has been removed, the pixel defining layer 200 can be cured at a third temperature. The third temperature may be higher than the first temperature and the second temperature and may be, for example, about 230° C. or higher, or may be about 250° C. to about 300° C. During curing, the edge of the pixel defining layer 200 may reflow due to the high temperature. Accordingly, the gap G between the pixel defining layer 200 and the pixel electrode E1 may be filled, such that the pixel defining layer 200 may directly contact the upper surface of the edge of the pixel electrode E1 and may cover the edge of the pixel electrode E1. As the edge of the pixel defining layer 200 spreads to the opening OP, a width of the opening OP may be reduced and a double step structure of the pixel defining layer 200 may be formed. An edge portion of the pixel defining layer 200 may have an inflection point P. A slope of the upper surface of the pixel defining layer 200 between the spacer 205 and the inflection point P is greater than a slope of the upper surface of the pixel defining layer 200 between the inflection point P and the opening OP in the cross-sectional view.

Figure 11:
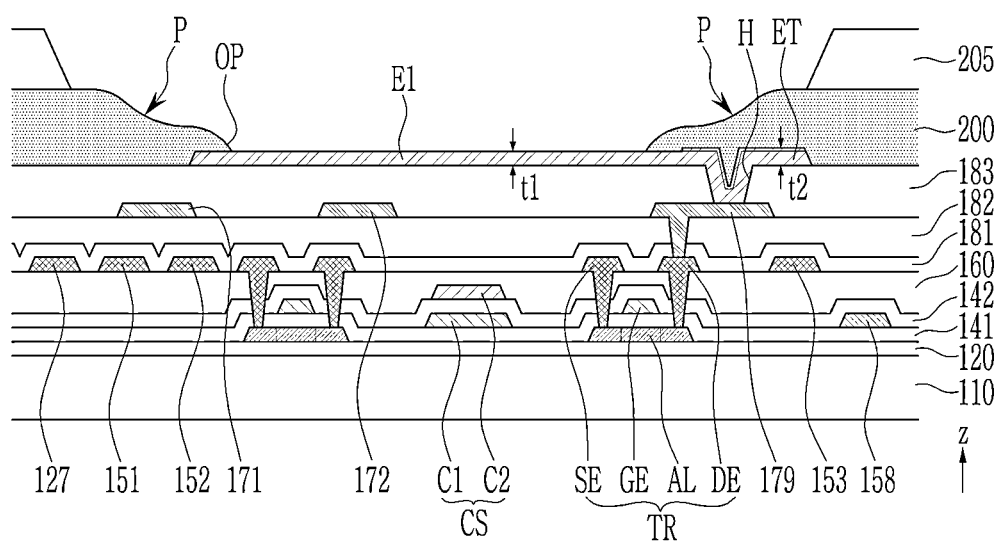

Referring to FIG. 11, a spacer 205 may be formed on the pixel defining layer 200. The spacer 205 may support a fine metal mask used for deposition of the emission layer EL, to prevent the fine metal mask from damaging to the underlying structure. The spacer 205 may include a material different from that of the pixel defining layer 200, and may include an organic insulating material such as an acryl-based polymer, an imide-based polymer, or an amide-based polymer. The spacer 205 may have one or more shapes, such as one or more of polygons, triangles, and/or circles in a plan view of the display device.

Figure 12:
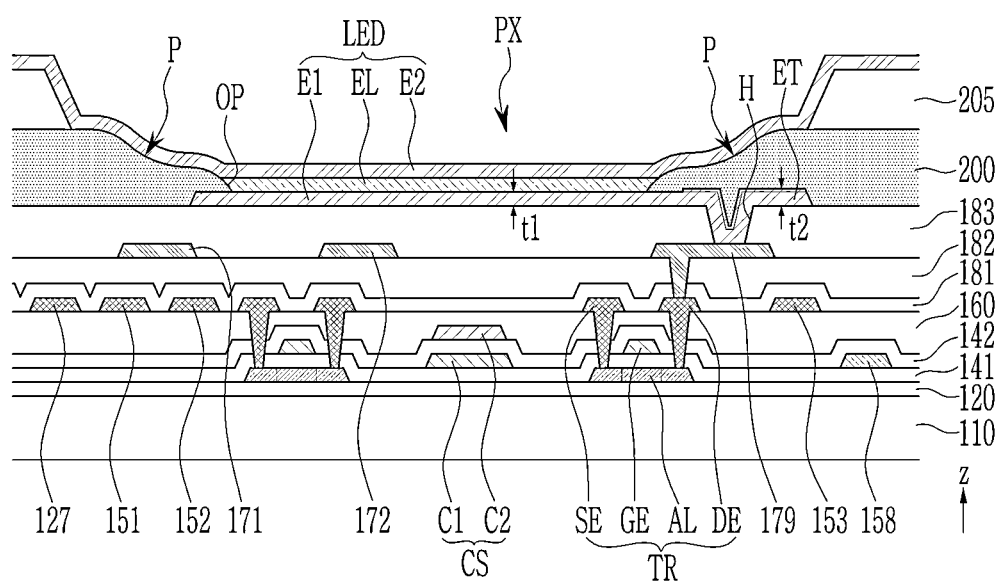

Referring to FIG. 12, the emission layer EL may be formed on the pixel electrode E1, and the common electrode E2 may be formed on the emission layer EL. The emission layer EL may be deposited using a fine metal mask, and the common electrode E2 may be deposited using an open mask. Subsequently, the encapsulation layer EC shown in FIG. 2 can be formed on the common electrode E2.

Figure 13:
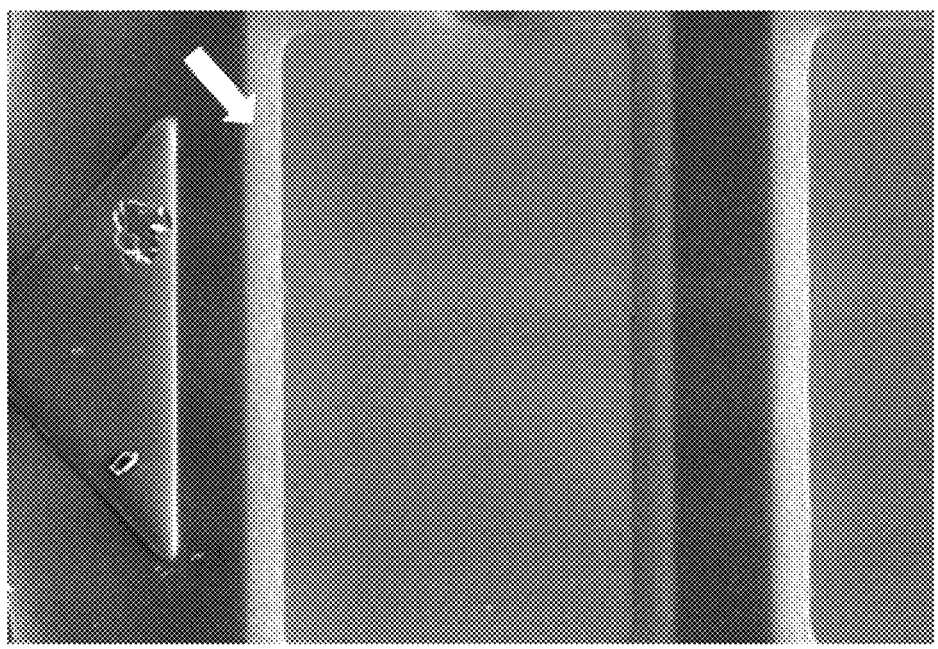
FIG. 13 is a picture showing an opening of a pixel defining layer and the vicinity in a display panel in a plan view of a light emitting display device according to an embodiment.

FIG. 13 is a picture showing an opening of a pixel defining layer and the vicinity in a display panel in a plan view of a light emitting display device according to an embodiment.

Referring to FIG. 13, a relatively bright part indicated by the arrow corresponds to an edge portion of the substantially quadrangular-shaped pixel defining layer 200 that defines the opening OP. The edge of the pixel defining layer 200 is gently slanted and has a double step structure. The double step structure may be resulted from removing the portion of the masking layer 196 on the pixel electrode E1 and then reflowing the edge of the pixel defining layer 200 during curing of the pixel defining layer 200. The triangle structure on the left is the spacer 205 formed on the pixel defining layer 200.

Figure 14:
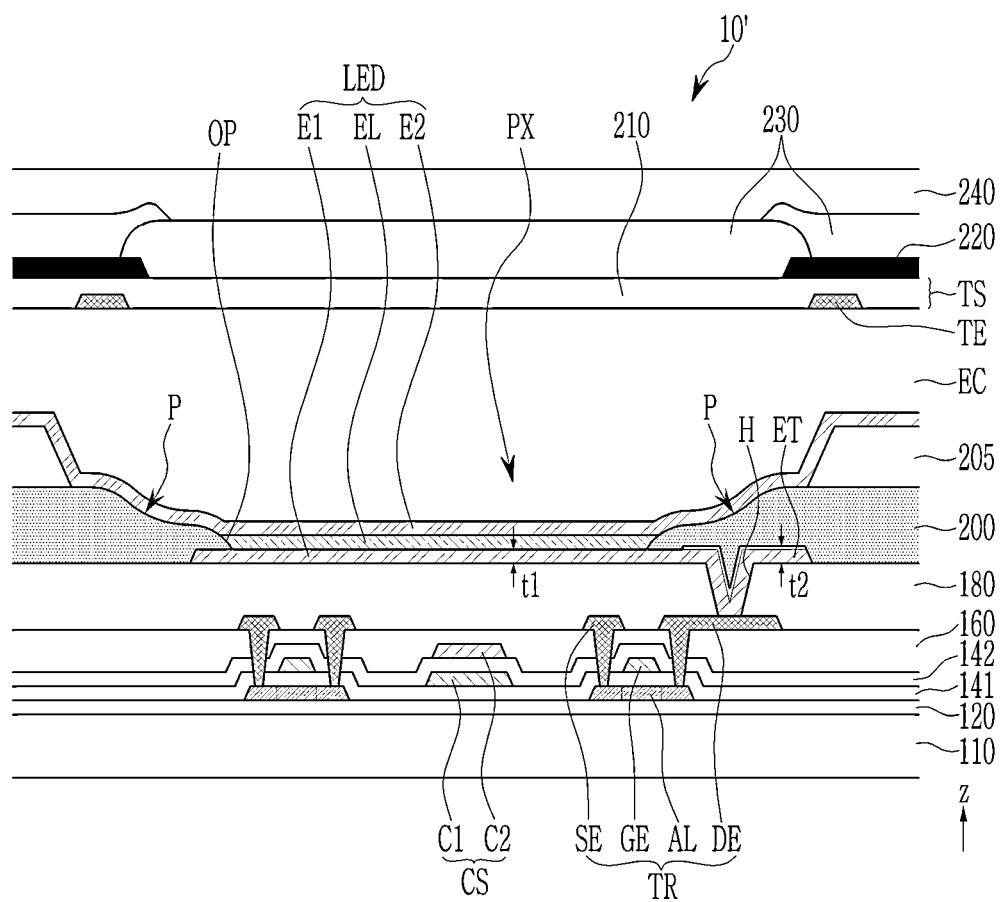
FIG. 14 is a schematic cross-sectional view of one pixel area of a display panel of a light emitting display device according to an embodiment.

FIG. 14 is a schematic cross-sectional view of one pixel area of a display panel of a light emitting display device according to an embodiment.

In contrast with the display panel 10 shown in FIG. 2, a display panel 10' shown in FIG. 14 does not include a second conductive layer. In the display panel 10', a planarization layer 180 may be positioned on a first data conductive layer that includes a first electrode SE and a second electrode DE of a transistor TR, and an extension electrode ET may extend from a pixel electrode E1 and may be connected to the second electrode DE of the transistor TR through a contact hole H formed in the planarization layer 180. Accordingly, the pixel electrode E1 may be connected to the second electrode DE of the transistor TR through the extension electrode ET. The initialization voltage line 127, the scan line 151, the previous scan line 152, the light emission control line 153, the data line 171, and the driving voltage line 172 described with reference to FIG. 2 may be included in a first gate conductive layer, a second gate conductive layer, a first data conductive layer, or another possible conductive layer.

Figure 15:
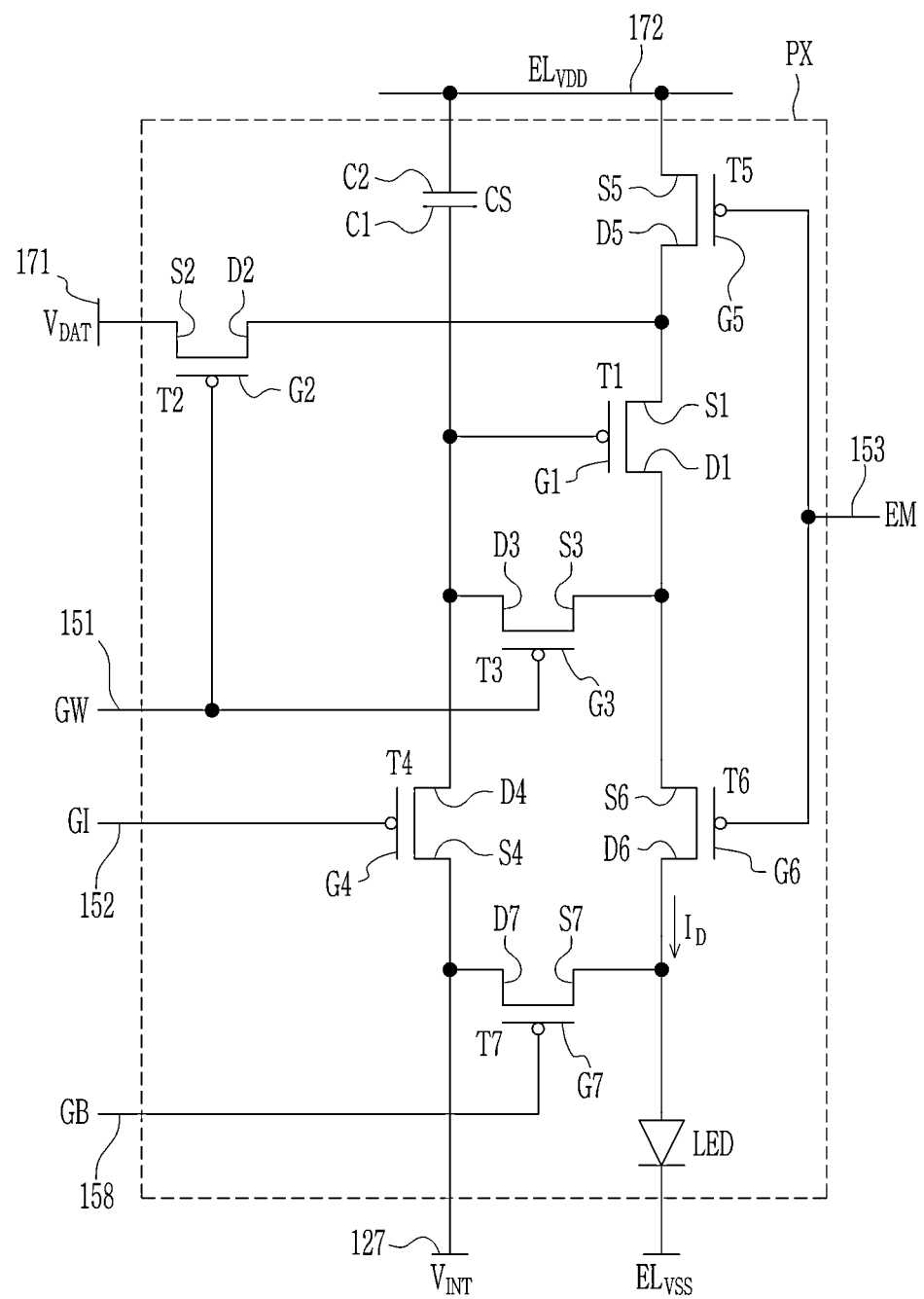
FIG. 15 is an equivalent circuit diagram of a pixel of a light emitting display device according to an embodiment.

FIG. 15 is an equivalent circuit diagram of a pixel of a light emitting display device according to an embodiment.

Referring to FIG. 15, a pixel PX may include transistors T1 to T7 connected to signal lines 127, 151, 152, 153, 158, 171, and 172, a storage capacitor CS, and a light emitting diode LED.

The transistors T1 to T7 may include a driving transistor T1, a switching transistor T2, a compensation transistor T3, an initialization transistor T4, an operation control transistor T5, a light emission control transistor T6, and a bypass transistor T7.

The signal lines 127, 151, 152, 153, 158, 171, and 172 may include an initialization voltage line 127, a scan line 151, a previous scan line 152, a light emission control line 153, a bypass control line 158, a data line 171, and a driving voltage line 172.

The scan line 151 may transmit a scan signal GW to the switching transistor T2 and the compensation transistor T3. The previous scan line 152 may transmit a previous scan signal GI to the initialization transistor T4. The light emission control line 153 may transmit an emission control signal EM to the operation control transistor T5 and the emission control transistor T6. The bypass control line 158 may transmit a bypass signal GB to the bypass transistor T7. A bypass control line 158 may also be connected to a previous scan line 152.

The data line 171 may receive a data voltage $V_{DAT}$, and the driving voltage line 172 and the initialization voltage line 127 may receive a driving voltage $EL_{VDD}$ and an initialization voltage VINT, respectively. The initialization voltage VINT may initialize the driving transistor T1.

The transistors T1 to T7 respectively include gate electrodes G1, G2, G3, G4, G5, G6, and G7, may respectively include first electrodes S1, S2, S3, S4, S5, S6, and S7, and may respectively include second electrodes D1, D2, D3, D4, D5, D6, and D7. The storage capacitor CS includes a first electrode C1 and a second electrode C2. The electrodes of the transistors T1 to T7 and the electrodes of the storage capacitor CS may be connected as shown in FIG. 15. An anode of the light emitting diode LED may be connected with the second electrode D1 of the driving transistor T1 through the transistor T6, and may be supplied with a driving current ID. A cathode of the light emitting diode LED may is applied with a common voltage $EL_{VSS}$ (also referred to as a second power voltage or a low potential power voltage).

In the circuit structure of the pixel PX, the number of transistors, the number of capacitors, and the connection between them can be modified according to embodiments.

While examples of embodiments have been described, practical embodiments are not limited to the disclosed embodiments. Practical embodiments are intended to cover various modifications and equivalent arrangements within the scope of the appended claims.

What is claimed is:

1. A light emitting display device comprising:
a substrate;
a transistor overlapping the substrate;
an insulating layer overlapping the transistor;
a pixel electrode disposed on a face of the insulating layer;
an extension electrode extending from the pixel electrode, wherein the pixel electrode is electrically connected through the extension electrode to the transistor; and
a pixel defining layer disposed on the insulating layer, including an opening that exposes the pixel electrode, and covering the extension electrode, wherein a section of the extension electrode extends lengthwise parallel to the face of the insulating layer and is thicker than the pixel electrode in a direction perpendicular to the face of the insulating layer, wherein an upper surface of the pixel defining layer has a concave structure that overlaps the extension electrode.

2. The light emitting display device of claim 1, wherein the extension electrode comprises a first layer and a second layer, and wherein the first layer is disposed between the second layer and the pixel defining layer and comprises an oxide semiconductor.

3. The light emitting display device of claim 2, wherein the first layer comprises at least one of an indium-zinc oxide (IZO), an indium-gallium-zinc oxide (IGZO), an indium-zinc-tin oxide (IZTO), a zinc-tin oxide (ZTO), and a zinc oxide (ZnO).

4. The light emitting display device of claim 2, wherein the second layer is directly connected to the pixel electrode.

5. The light emitting display device of claim 4, wherein the second layer comprises a first transparent conductive oxide layer, a metal layer, and a second transparent conductive oxide layer.

6. The light emitting display device of claim 2, wherein the extension electrode is thicker than the pixel electrode by a thickness of the first layer.

7. The light emitting display device of claim 1, wherein the pixel defining layer has a convex structure positioned between the concave structure and the opening.

8. The light emitting display device of claim 1, wherein the insulating layer includes a contact hole, and wherein the extension electrode is partially disposed inside the contact hole.

9. The light emitting display device of claim 1, wherein the pixel defining layer is a black pixel defining layer including a black pigment.

10. A light emitting display device comprising:
a substrate;
a transistor overlapping the substrate;
an insulating layer overlapping the transistor;
a pixel electrode disposed on a face of the insulating layer and including a first plurality of conductive layers;
an extension electrode extending from the pixel electrode, disposed on the face of the insulating layer, including a second plurality of conductive layers, and including an oxide semiconductor layer disposed on the second plurality of conductive layers, wherein the pixel electrode is electrically connected through the extension electrode to the transistor;
a pixel defining layer disposed on the insulating layer, exposing an exposed portion of the pixel electrode, covering an edge of the pixel electrode, and covering the extension electrode, wherein an upper surface of the pixel defining layer has a concave structure that overlaps the extension electrode;
an emission layer overlapping the exposed portion of the pixel electrode; and
a common electrode overlapping the emission layer.

11. The light emitting display device of claim 10, wherein the oxide semiconductor layer comprises at least one of an indium-zinc oxide (IZO), an indium-gallium-zinc oxide (IGZO), an indium-zinc-tin oxide (IZTO), a zinc-tin oxide (ZTO), and a zinc oxide (ZnO).

12. The light emitting display device of claim 10, wherein the second plurality of conductive layers is directly connected to the first plurality of conductive layers.

13. The light emitting display device of claim 10, wherein a section of the extension electrode extends lengthwise parallel to the face of the insulating layer and is thicker than the pixel electrode in a direction perpendicular to the face of the insulating layer.

14. The light emitting display device of claim 10, further comprising: a spacer, wherein the pixel defining layer is disposed between the insulating layer and the spacer and includes a black pigment, and wherein a material of the spacer is different from a material of the pixel defining layer.

15. The light emitting display device of claim 10, further comprising: a connecting member, wherein the oxide semiconductor layer is electrically connected through the second plurality of conductive layers to the connecting member, and wherein the second plurality of conductive layers is electrically connected through the connecting member to the transistor.

\* \* \* \* \*